(12) United States Patent
Talledo et al.

(10) Patent No.: US 9,768,126 B2
(45) Date of Patent: Sep. 19, 2017

(54) STACKED SEMICONDUCTOR PACKAGES WITH CANTILEVER PADS

(71) Applicant: STMicroelectronics, Inc., Calamba (PH)

(72) Inventors: Jefferson Talledo, Calamba (PH); Godfrey Dimayuga, San Pablo (PH)

(73) Assignee: STMICROELECTRONICS, INC., Calamba (PH)

( * ) Notice: Subject to any disclaimer, the term of this patent is extended or adjusted under 35 U.S.C. 154(b) by 7 days.

(21) Appl. No.: 14/721,831

(22) Filed: May 26, 2015

(65) Prior Publication Data

US 2016/0190072 A1    Jun. 30, 2016

Related U.S. Application Data

(63) Continuation-in-part of application No. 14/582,581, filed on Dec. 24, 2014.

(51) Int. Cl.
*G01R 31/20* (2006.01)
*H01L 23/00* (2006.01)
(Continued)

(52) U.S. Cl.
CPC .......... *H01L 23/562* (2013.01); *H01L 21/486* (2013.01); *H01L 21/4857* (2013.01); *H01L 23/13* (2013.01); *H01L 23/49822* (2013.01); *H01L 23/49827* (2013.01); *H01L 24/17* (2013.01); *H01L 24/81* (2013.01); *H01L 25/105* (2013.01); *H01L 23/3128* (2013.01); *H01L 23/49816* (2013.01); *H01L 2224/16055* (2013.01); *H01L 2224/16057* (2013.01); *H01L 2224/16227* (2013.01);
(Continued)

(58) Field of Classification Search
CPC ........... H01L 21/4857; H01L 23/49811; H01L 23/49816; H01L 23/49822; H01L 2924/0002; H01L 2924/15183; H01L 2924/15311; H01L 2924/181; H01L 2224/32225; H01L 2224/48091; H01L 2224/48227; H01L 2224/48228; H01L 2224/73265
USPC ............... 257/686, 737, 738, 780, 781, 782; 324/754.07–754.14, 755.01, 755.04, 324/755.05, 755.06, 755.07, 324/756.03–756.07, 762.01–762.06; 438/14, 17, 18, 52, 107, 109, 117, 455, 438/456, 461, 611, 612, 613, 618, 637, 438/638
See application file for complete search history.

(56) References Cited

U.S. PATENT DOCUMENTS 6,064,576 A * 5/2000 Edwards ................. H01L 23/13
                                                              174/260
6,114,864 A * 9/2000 Soejima ............. G01R 1/07342
                                                              324/72.5
(Continued)

*Primary Examiner* — Arleen M Vazquez
*Assistant Examiner* — Steven Yeninas
(74) *Attorney, Agent, or Firm* — Seed Intellectual Property Law Group LLP

(57) ABSTRACT

One or more embodiments are directed to semiconductor packages, including stacked packages, with one or more cantilever pads. In one embodiment a recess is located in a substrate of the package facing the cantilever pad. The cantilever pad includes a conductive pad on which a conductive ball is formed. The cantilever pad is configured to absorb stresses acting on the package.

19 Claims, 10 Drawing Sheets

(51) Int. Cl.
*H01L 23/13* (2006.01)
*H01L 25/10* (2006.01)
*H01L 21/48* (2006.01)
H01L 23/498 (2006.01)
H01L 23/31 (2006.01)

(52) U.S. Cl.
CPC .............. *H01L 2224/81191* (2013.01); *H01L 2225/1023* (2013.01); *H01L 2225/1058* (2013.01); *H01L 2924/15311* (2013.01); *H01L 2924/15331* (2013.01); *H01L 2924/35* (2013.01); *H01L 2924/3511* (2013.01)

(56) References Cited

U.S. PATENT DOCUMENTS

| | | | |
|---|---|---|---|
| 6,759,261 B2 * | 7/2004 | Shimokohbe | B81C 1/00682 438/48 |
| 6,922,069 B2 * | 7/2005 | Jun | G01R 1/07357 324/755.07 |
| 6,992,399 B2 * | 1/2006 | Stewart | B81C 1/00238 257/779 |
| 7,002,225 B2 | 2/2006 | Stewart | |
| 7,759,161 B2 * | 7/2010 | Tanaka | H01L 23/481 257/686 |
| 2002/0190396 A1 * | 12/2002 | Brand | H01L 21/565 257/787 |
| 2003/0054590 A1 * | 3/2003 | Murayama | H01L 24/97 438/109 |
| 2008/0023814 A1 * | 1/2008 | Yang | H01L 25/105 257/686 |
| 2016/0096724 A1 | 4/2016 | Dawson et al. | |

\* cited by examiner

STACKED SEMICONDUCTOR PACKAGES WITH CANTILEVER PADS

BACKGROUND

Technical Field

Embodiments of the present disclosure are directed to semiconductor packages, including a package on package (PoP), and methods of making same.

Description of the Related Art

Reliability of semiconductor packages is of significant importance. Although various issues cause reliability problems in semiconductor packages, one known reason for reliability issues is that packages and the substrates or boards, onto which the package are mounted, are formed of various types of materials, each having different coefficients of thermal expansion (CTE). During use, heat is generated, and due to differing CTEs, stress may be introduced into the package and/or the board. The stress can cause cracks, for instance, in solder joints, such as those that couple the semiconductor package to a printed circuit board (PCB), thereby affecting board level reliability of the package by disrupting the electrical coupling between the package and the PCB.

Problems caused by differing CTEs may be further compounded when packages are stacked on top of each other, such as in stacked packages also referred to as a PoP. Typically in a PoP the stacked packages are coupled together by conductive balls located between adjacent packages. Each package may warp due to the stresses introduced into the package due to the differing CTEs. Furthermore, two adjacent packages may warp away from each other such that an upper package bows upward and a lower package bows downward, thereby placing the conductive balls in tensile stress, particularly, the conductive balls at the perimeter of the PoP. Additionally, as greater numbers of packages are stacked on top of each other, the stresses induced on the solder balls interconnecting the packages may increase.

BRIEF SUMMARY

One or more embodiments are directed to semiconductor packages with one or more cantilever pads. In one embodiment a recess is located in a substrate of the package facing the cantilever pad. The cantilever pad includes a conductive pad on which a conductive ball is formed. The cantilever pad is configured to absorb stresses acting on the package. For instance, the cantilever pad may be configured to flex into the recess and/or flex outwardly therefrom. In that regard, the cantilever pad may respond readily in response to stress that is acting on various materials of the semiconductor package. For instance, during operation, the cantilever pad may be configured to flex inward, toward the recess, and/or outward, away from the recess, in response to expansion of one or more materials caused by various materials having differing CTEs and expanding at differing rates. Thus, the likelihood of cracks being formed in electrical structures of the package or a PCB coupled to the package is reduced. In one embodiment, the cantilever pad may prevent or reduce the likelihood of cracks occurring in conductive balls that electrically couple the package to the PCB.

In some embodiments, cantilever pads are formed on two opposing sides of the substrate. Another embodiment is directed to a PoP including one or more packages with cantilever pads. In one embodiment, a PoP includes a first package vertically stacked on a second package. The first and second packages each include at least one cantilever pad. The second package includes a substrate and includes cantilever pads on opposing surfaces of the substrate.

BRIEF DESCRIPTION OF THE SEVERAL VIEWS OF THE DRAWINGS

In the drawings, identical reference numbers identify similar elements. The sizes and relative positions of elements in the drawings are not necessarily drawn to scale.

DETAILED DESCRIPTION

It will be appreciated that, although specific embodiments of the present disclosure are described herein for purposes of illustration, various modifications may be made without departing from the spirit and scope of the present disclosure.

In the following description, certain specific details are set forth in order to provide a thorough understanding of various aspects of the disclosed subject matter. However, the disclosed subject matter may be practiced without these specific details. In some instances, well-known structures and methods of semiconductor processing comprising embodiments of the subject matter disclosed herein have not been described in detail to avoid obscuring the descriptions of other aspects of the present disclosure.

Figure 1A:
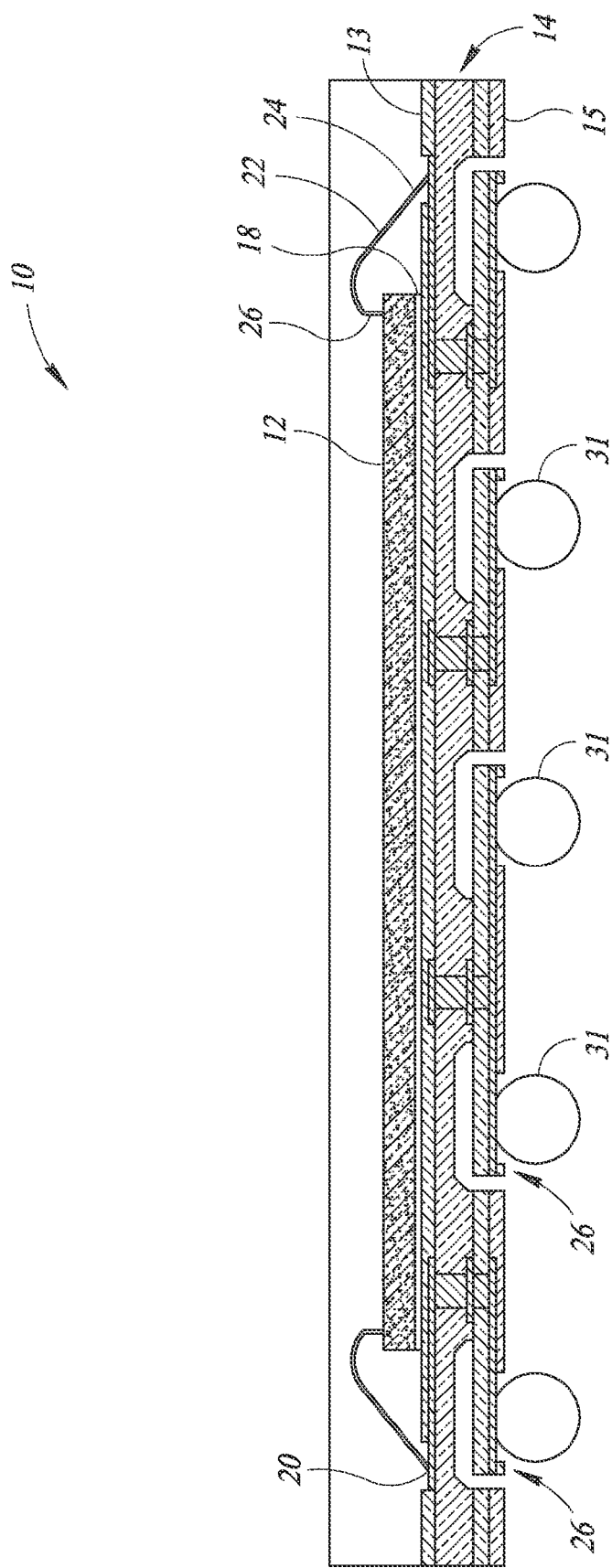
FIG. 1A is a cross-sectional view of a semiconductor package in accordance with one embodiment of the disclosure.
Figure 1B:
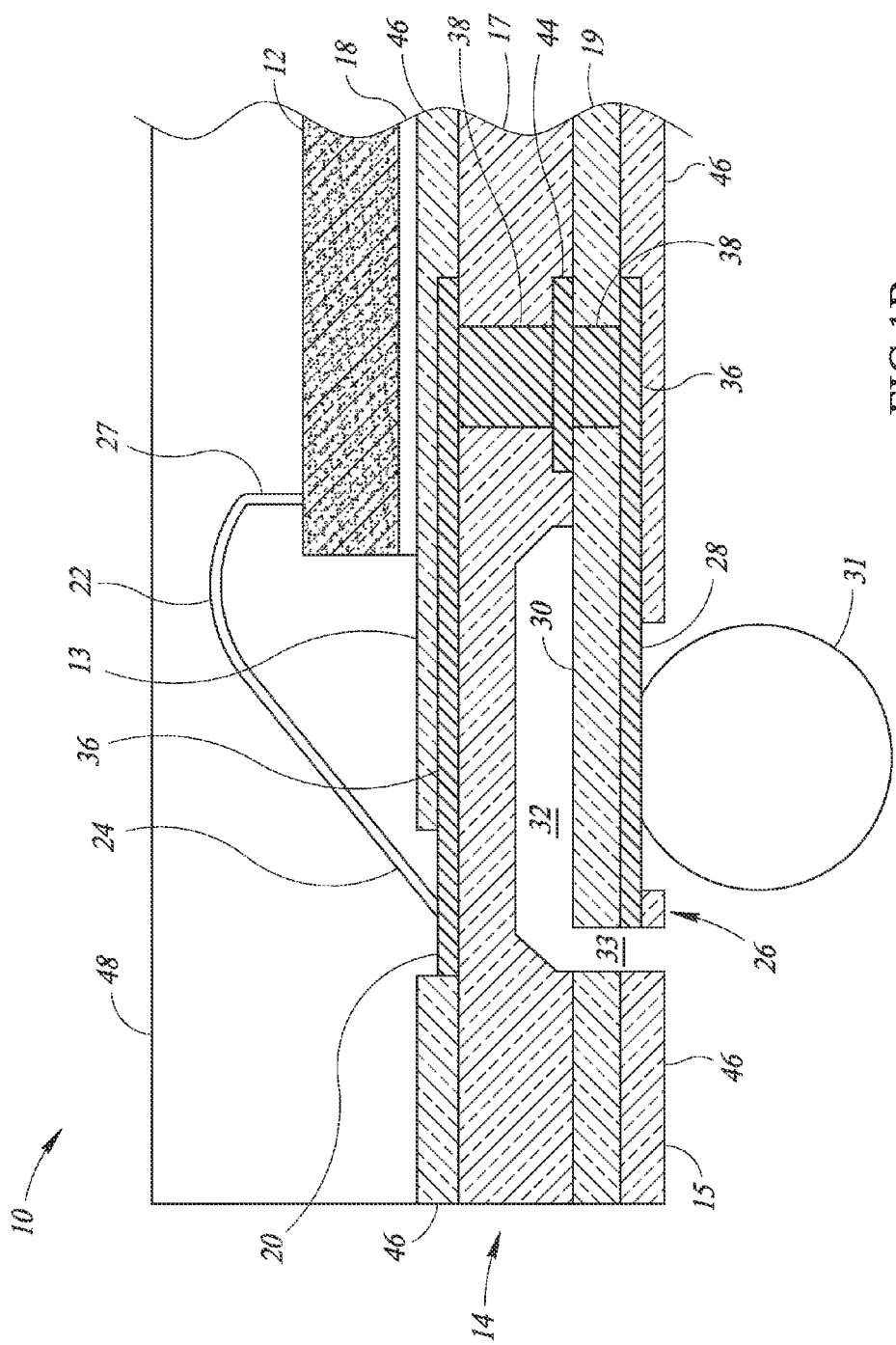
FIG. 1B is a close-up cross-sectional view of the package of FIG. 1.

FIG. 1A shows a cross-sectional view of a package 10 in accordance with one embodiment of the disclosure. FIG. 1B shows a close-up view of a portion of FIG. 1A. The package 10 includes a semiconductor die 12 on an upper surface 13 of a substrate 14. The semiconductor die 12 includes electrical structures of an electrical device, such as an integrated circuit.

The substrate 14 has a lower surface 15 opposite the upper surface 13 and includes one or more conductive and insulative layers. In the illustrated embodiment, the substrate 14 includes first and second layers 17, 19 of insulative material; however, the substrate 14 may include any number of insulative layers. The insulative layers may include any insulative material including ceramic, glass, polymer, or any other suitable insulative material. The one or more conductive layers may be any conductive material, such as a metal material. In one embodiment, the conductive layers are copper.

The semiconductor die 12 is coupled to the upper surface 13 of the substrate 14 by an adhesive material 18. The adhesive material 18 may be any adhesive material 18 that bonds the semiconductor die 12 to the upper surface 13 of the substrate 14, such as paste, glue, epoxy, double-sided tape, or any other suitable material.

The upper surface 13 of the substrate 14 includes a plurality of conductive fingers 20 located near one or more edges of the semiconductor die 12. Although only two conductive fingers 20 are shown, it is to be appreciated that any number of conductive fingers 20 may be provided, including just one. In some embodiments, a plurality of conductive fingers 20 is located on each side of the semiconductor die 12. In general, the conductive fingers 20 are electrically isolated from each other, however, two or more may be coupled together by one or more conductive traces.

The semiconductor die 12 is electrically coupled to the conductive fingers 20. In particular, the electrical device of the semiconductor die 12 is coupled to the conductive fingers 20 by conductive wires 22. More particularly, a first end 27 of the conductive wire 22 is coupled to a bond pad of the semiconductor die 12, which may be coupled to various electrical components of the electrical device, and a second end 24 of the conductive wire is coupled to the conductive finger. In another embodiment, the electrical device of the semiconductor die 12 is coupled to the conductive fingers 20 by flip chip arrangement, as is well known in the art. In that regard, the conductive fingers 20 would be located under the semiconductor die 12 and coupled to the bond pads of the semiconductor die 12 by conductive balls.

Figure 2:
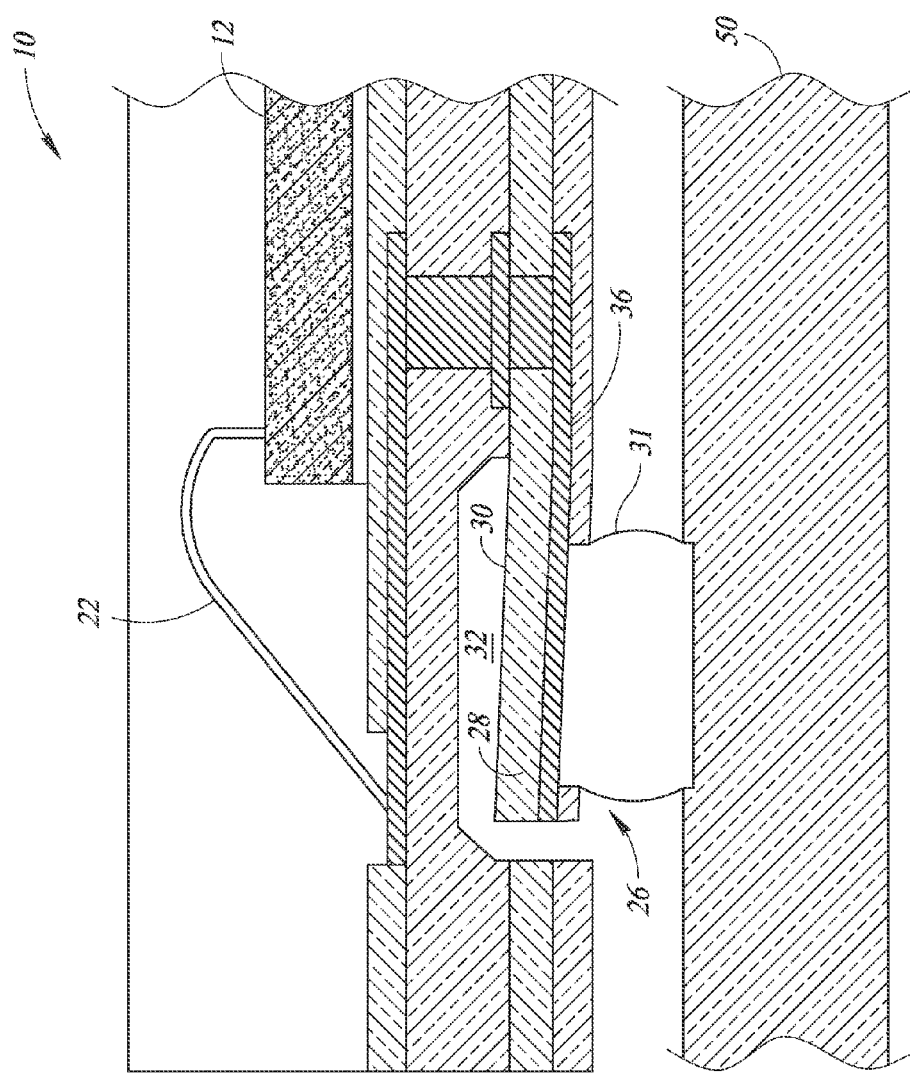
FIG. 2 is a close-up cross-sectional view of the package of FIG. 1 coupled to another device.

The lower surface 15 of the substrate 14 includes a plurality of cantilever pads 26. As best shown in FIG. 1B, the cantilever pads 26 include a conductive pad 28 that is supported by a substrate support portion 30. On the conductive pad 28 of the cantilever pad 26 is a conductive ball 31, such as a solder ball, that is configured to couple the package 10 to another substrate or board, such as a PCB 50 (FIG. 2).

Figure 1C:
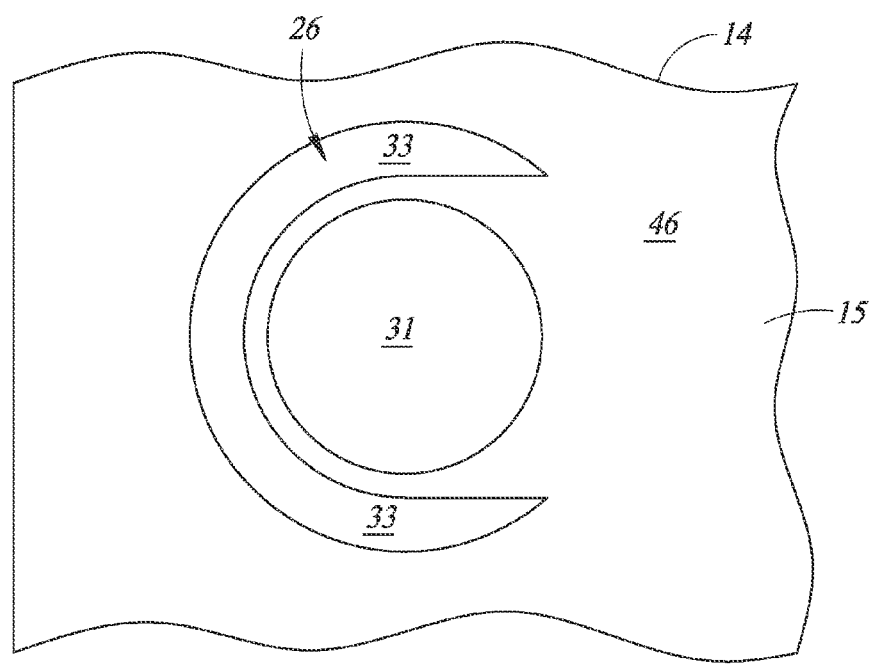
FIG. 1C is a close-up bottom view of the close-up view of FIG. 1B.

The cantilever pads 26 are cantilevered by recesses 32 located above the cantilever pads 26 and by through openings 33 in the substrate 14 along three sides of the cantilever pads 26. In particular, the recesses 32 are located in the first layer 17 and the through openings 33 are located in the second layer 19 in communication with the recesses 32. As best shown in FIG. 1C, through openings 33 extend from one end and along side surfaces of the cantilever pads 26 forming a C-shape in planar view. The through openings 33, in planar view, may be any shape that forms a cantilever pad with the recess 32. For instance, the through openings 33 may also be V-shaped or U-shaped.

The thickness of the cantilever pad 26 is any thickness that provides suitable structural support for the cantilever pad 26 when the package 10 is attached to another substrate or board, while also allowing some flexing of the cantilever pad 26. The cantilever pad 26 may allow flexing in one direction, such as into or away from the recess 32, or in two directions, such as both into and away from the recess 32.

The recess 32 may have a depth that is sufficient to provide adequate clearance in view of the flexing of the cantilever pad 26 into the recess 32 such that an upper surface of the cantilever pad 26 does not abut against the inner surface of the substrate 14 that delimits the recess 32.

The conductive fingers 20 are electrically coupled to conductive pads 28 of the cantilever pads 26 by one or more conductive traces 36 and through vias 38 that extend through the substrate 14. That is, the conductive fingers 20 are coupled to the trace 36 located above the first layer 17. The trace 36 on the first layer 17 is coupled to the trace 36 on the second layer 19 by through vias 38 that extend through the first and second layers 17, 19 of the substrate 14. In the illustrated embodiment, an inner trace 44 couples the through via 38 in the first layer 17 to the through via 38 in the second layer 19.

A dielectric layer 46 is located over the traces 36 and on the first and second surfaces of the substrate 14. The dielectric layer 46 may be any material that can provide protection from environmental sources of damage, such as corrosion, physical damage, moisture damage, or other causes of damage to electrical features. In one embodiment, the dielectric layer 46 is a solder mask material. The solder mask may be a liquid material that hardens, such as during a curing process.

Encapsulation material 48 is located over the substrate, surrounding the die, the conductive fingers 20, and the conductive wires 22. The encapsulation material 48 may be any material configured to provide protection from environmental sources of damage, such as corrosion, physical damage, moisture damage, or other causes of damage to electrical devices. The encapsulation material 48 may be a molding compound that includes one or more of polymer, polyurethane, acrylic, epoxy resin, silicone, or any other suitable material.

FIG. 2 shows a portion of the package 10 coupled to a board, such as a printed circuit board (PCB) 50 by the conductive balls 31. As shown in FIG. 2, the cantilever pad 26 flexes into the recess 32. The cantilever pad 26 may be able to absorb stresses created in various materials or components of the package or components coupled to the package. In particular, the cantilever pad 26 can move into and/or away from the recess 32 in response to forces, such as those caused by thermal expansion of one or more components, thereby preventing or reducing the likelihood of cracks being formed in electrical components, such as conductive balls 31. Due to the flexibility of cantilever pad 26, the conductive joint reliability or solder joint reliability of the package 10 is improved.

The cantilever pad 26 may flex into the recess 32 during the mounting process in which the package 10 is mounted to the PCB 50 as well. For instance, due to nonplanar conductive balls 31 (e.g., standoff height differences of the conductive balls), some cantilever pads 26 may flex inward or outward from the recess. In some embodiments, pressure may be applied during mount, thereby placing a force on the cantilever pads 26 to move inward. Nonplanar conductive balls may be caused by dispensing different proportions of conductive material that form the balls or by warping of various components of the package.

The package 10 may include any number of cantilever pads 26. In one embodiment, all of the conductive pads of a package are cantilever pads 26. In other embodiments, only some of the conductive pads of a package are cantilever pads 26, while the other conductive pads are not cantilevered. In one embodiment, cantilever pads 26 are positioned on the package in locations that correspond to the largest amount of expected stress to be applied to the pad and conductive ball located on the pad.

Figure 3:
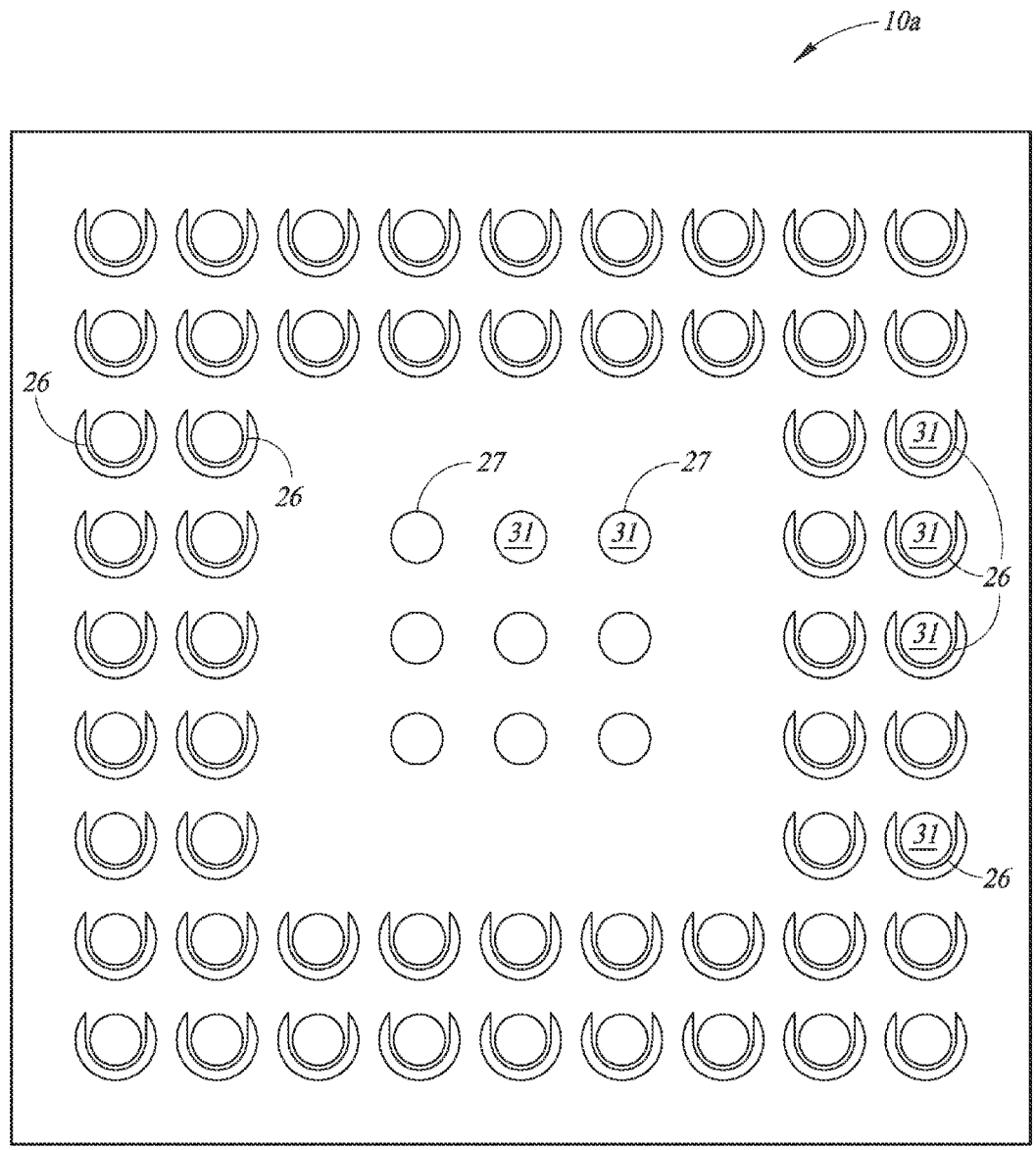
FIG. 3 illustrates a bottom surface of a package that includes some cantilever pads in accordance with one embodiment.

FIG. 3 illustrates a layout of a bottom surface of a package 10a that includes conductive balls 31 secured to cantilever pads 26 as described above and traditional pads 27 that are not cantilevered. That is, the cantilever pads 26 and conductive ball 31 are located at the perimeter of the package 10a, while the conductive pads 28 and conductive ball 31 at the center of the package 10a are traditional, non-cantilevered pads. In some embodiments, during thermal expansion, the conductive pads and bumps located at the perimeter of a package may be exposed to greater stresses than the central pads. In that regard, the cantilever pads 26 at an outer perimeter of the package are able to flex in response to stress induced therein, while the center pads are not exposed to substantial stresses.

Figure 4A:
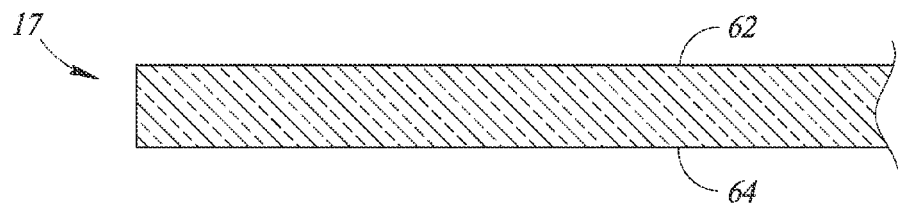
FIGS. 4A-4H illustrate cross-sectional views showing the packages of FIG. 1 being assembled in the close-up view of FIG. 1B at various stages of manufacture in accordance with one embodiment.

FIGS. 4A-4H illustrate cross-sectional views illustrating the package 10 of FIG. 1A being assembled in the close-up view of FIG. 1B at various stages of manufacture in accordance with one embodiment. FIG. 4A shows a first layer 17 of insulative core material which may be ceramic, glass, polymer, or any suitable core material. Although not shown, the first layer 17 may, in some embodiments, be coupled to a support structure during at least a portion of the processing. The first layer 17 of insulative material has a first surface 62 and a second surface 64.

Figure 4B:
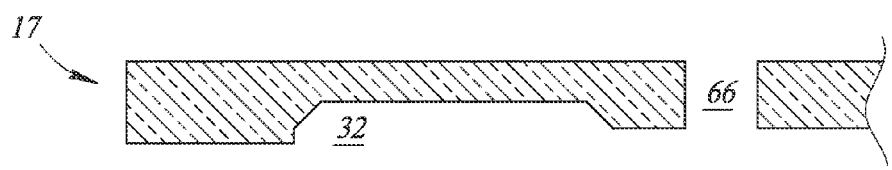

As shown in FIG. 4B, portions of the first layer 17 of the insulative material are removed. In particular, recesses 32 are formed in the second surface 64 of the first layer 17 and through holes 66 are formed that extend from the first surface 62 to the second surface 64. The recesses 32 correspond to locations for the cantilever pads 26 and the through holes 66 correspond to locations for the conductive through vias 38 of FIGS. 1A and 1B.

The recess 32 and through hole 66 are formed using standard semiconductor processing, including patterning the second surface using light sensitive material, such as photoresist and etching, for example, wet and/or dry etching. Although only one recess and through hole are shown, it will be clear to persons of ordinary skill in the art that a plurality of recesses 32 and through holes 66 are formed in the second surface 64 of the first layer 17.

Figure 4C:
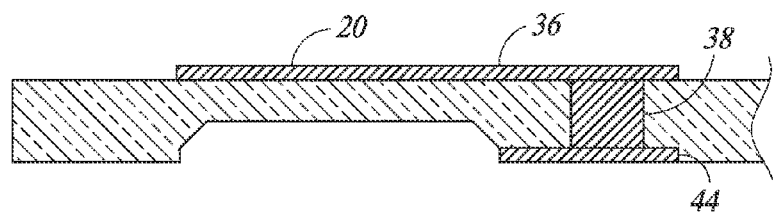

As shown in FIG. 4C, the through hole 66 is filled with a conductive material to form a conductive through via 38. Similarly, conductive material is deposited on the first and second surfaces 62, 64 of the first layer 17 above and below the conductive through vias 38 forming traces 36 and the conductive fingers 20. The deposition is performed using standard semiconductor processing techniques, which may include patterning the conductive material or blanket depositing the conductive material and then removing portions of the conductive material to form traces and conductive fingers. As mentioned above, the conductive material may be any conductive material, and in one embodiment is copper. In another embodiment the conductive material in the through via may be different from the conductive material forming the traces.

Figure 4D:
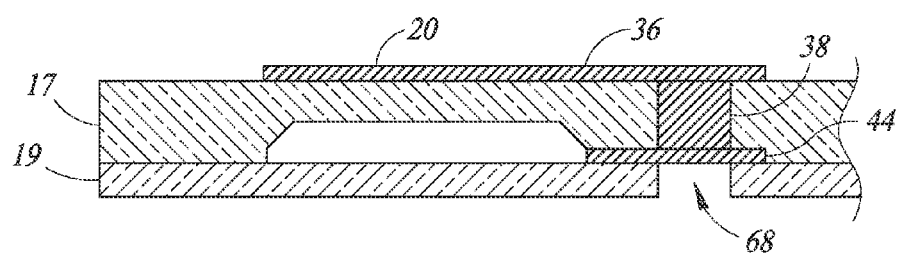

As shown in FIG. 4D, a second layer 19 of insulative material is secured to the second surface 64 of the first layer 17. The second layer 19 may be secured to the first layer 17 by any method, including by lamination, which may include pressure and/or heat. The thickness of the second layer 19 varies depending on the material properties used for the second layer 19 and may also depend on the mechanical properties of the conductive material that forms the trace 36 and conductive pad 28. In an embodiment in which the second layer 19 is ceramic, the second layer 19 may be a thin film.

As shown in FIG. 4D, a through hole 68 is formed in the second layer 19 below the conductive through via 38 in the first layer 17. The through hole 68 is formed using standard processing techniques, including patterning and etching as referenced above. The through hole 68 may be formed prior to securing the second layer 19 to the first layer 17 or after.

Figure 4E:
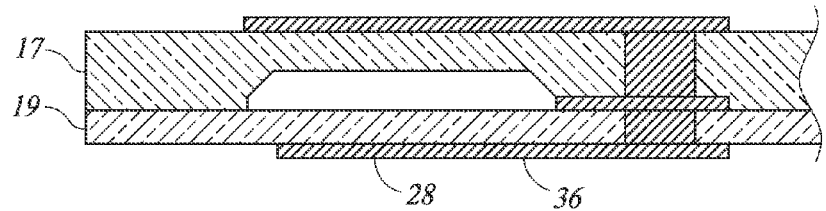

As shown in FIG. 4E, conductive material is deposited in the through hole 68 of the second layer 19 to form a conductive through via 38. The through via 38 of the second layer 19 is electrically coupled to the through via 38 of the first layer 17 by the inner trace 44. It is noted that the inner trace 44 extends laterally beyond the through vias 38. The inner trace 44 may resolve any misalignment issues that occur between the through via 38 of the first layer 17 and the through via 38 of the second layer 19 in view of the through holes 66 and 68 being etched in different processing steps.

As shown in FIG. 4E, a conductive material is deposited on the bottom surface of the second layer 19 to form trace 36 and conductive pad 28. The conductive material may be deposited and patterned using standard semiconductor techniques referenced above.

Figure 4F:
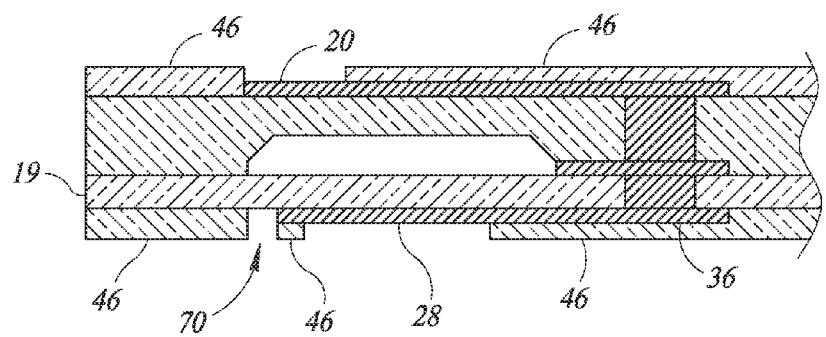

As shown in FIG. 4F, a dielectric layer 46 is deposited over portions of the first and second layers 17, 19 and various structures on the first and second layers 17 19, such as traces 36. The dielectric layer 46 is deposited by standard semiconductor processing techniques, including blanket deposition with patterning and etch or patterning light sensitive material then patterned deposition. As mentioned above, the dielectric layer 46 may be formed by depositing a liquid material that hardens. The liquid material may harden over time or may harden in a heating or curing step.

As shown in FIG. 4F, the conductive pad 28 on the second layer 19 remains exposed and conductive finger 20 on the first layer 17 remain exposed. Additionally, a portion 70 of the second layer 19 remains uncovered by the dielectric layer 46. The portion 70 is at least partially located below the recess 32.

The portion 70 that remains open has a shape that corresponds to the shape of the through opening 33 in FIG. 1C. As indicated above, the shape of the portion 70, however, may be any shape that when etched away causes a portion of the second layer 19 to form the cantilever pad 26 with the recess 32. Thus, the shape may be any two or three-sided shape, such as a C-shape, U-shape, V-shape, or any other suitable shape.

Figure 4G:
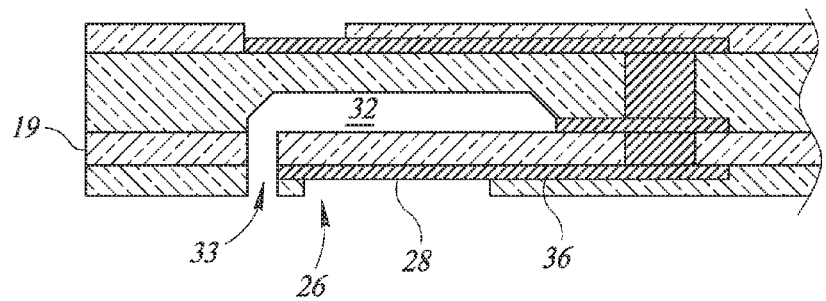

As shown in FIG. 4G, the portion 70 of the second layer 19 below the recess is removed, such as in a dry or wet etch step. In one embodiment, the dielectric layer acts as an etch mask. Upon removal of the portion 70 of the second layer 19, the cantilever pad 26 is formed.

Figure 4H:
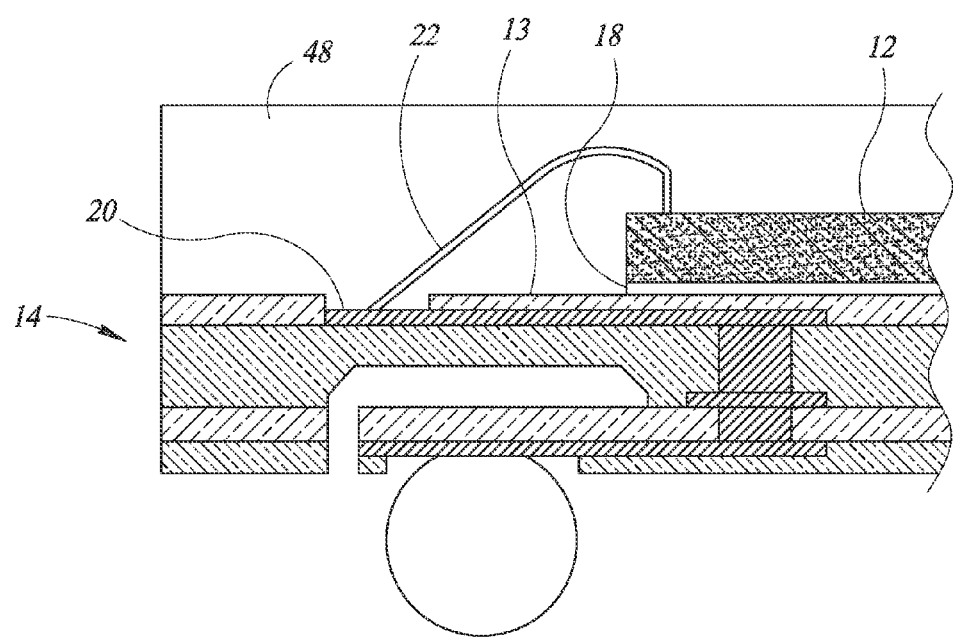

As shown in FIG. 4H, the semiconductor die 12 is coupled to the upper surface 13 of the substrate 14 by the adhesive material 18. That is, the adhesive material may be applied to one or both of the upper surface 13 and a back surface of the semiconductor die 12. The conductive wire 22 is coupled between the semiconductor die 12 and the conductive finger 20 as is well known in the art. An encapsulation material 48 is formed over the upper surface 13 of the substrate 14, encapsulating various components of the package. The encapsulation material may be formed using standard semiconductor processing techniques, including using a mold in which molding compound is injected therein and around the various components. The molding compound then hardens in a hardening step, which may include a curing or heat step. Conductive ball 31 may be formed on the cantilever pad 26, such as by solder dispensing techniques. In other embodiments, however, the conductive ball 31 is formed on another device to which the package 10 will be coupled.

It is to be understood that the method steps can be performed in any order and, thus, may be in a different order than is shown and described. For instance, the through opening 33 may be formed in the second layer 19 before coupling the first and second layers 17, 19 together.

Figure 5A:
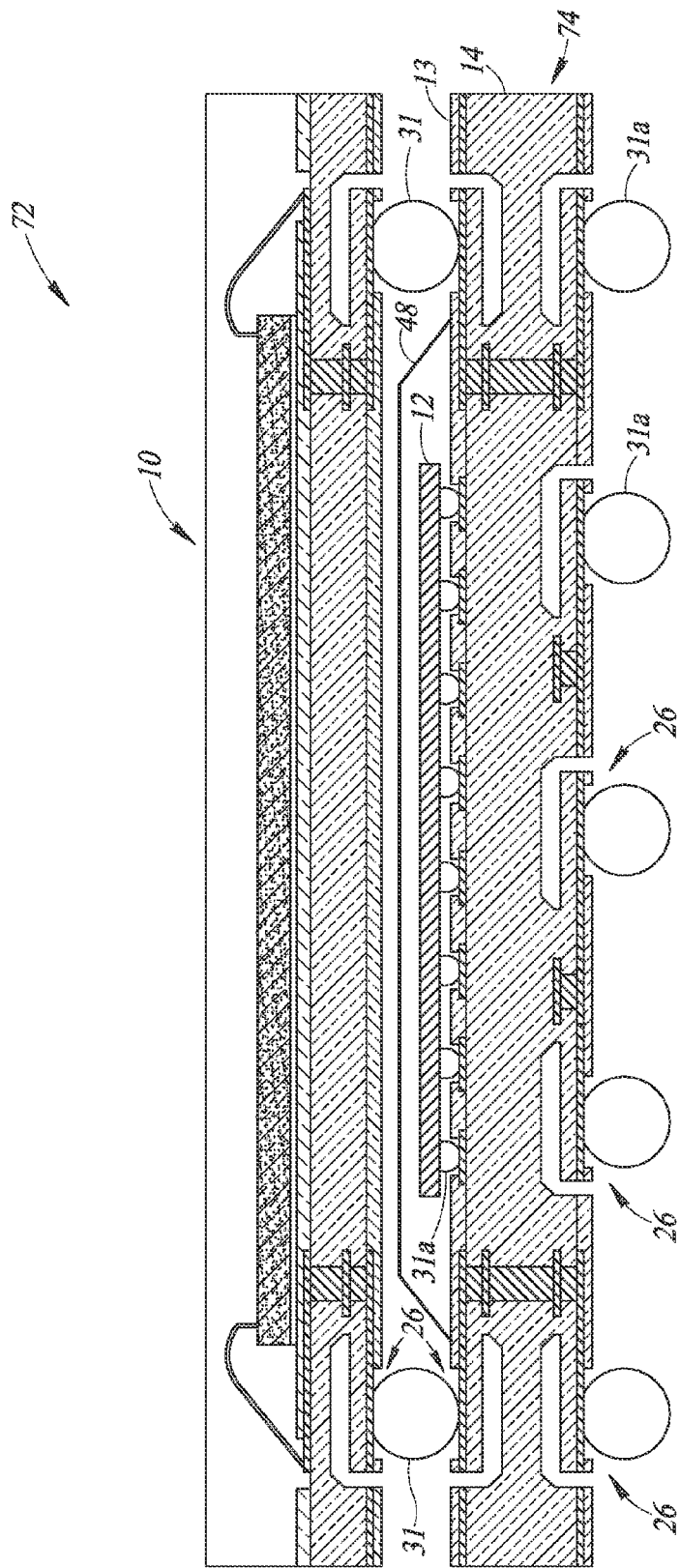
FIG. 5A illustrates a cross-sectional view of a PoP in accordance with one embodiment of the disclosure.

FIG. 5A shows a cross-sectional view of a stacked package or PoP 72 in accordance with one embodiment of the disclosure. The PoP 72 includes a first package, such as package 10 of FIG. 1, stacked on a second package 74. The first package 10 is mechanically and electrically coupled to the second package 74 by the conductive balls 31 of the first package 10. Although two packages are shown, the PoP may include more than two packages.

The second package 74 is substantially similar to the package 10 of FIG. 1 and includes many elements that are similar in structure and function to the elements of the first package 10. Thus, the structure and function of these similar elements will not be repeated in the interest of brevity. The elements of the second package 74 that are different from the first package 10 will be discussed in detail below.

Figure 5B:
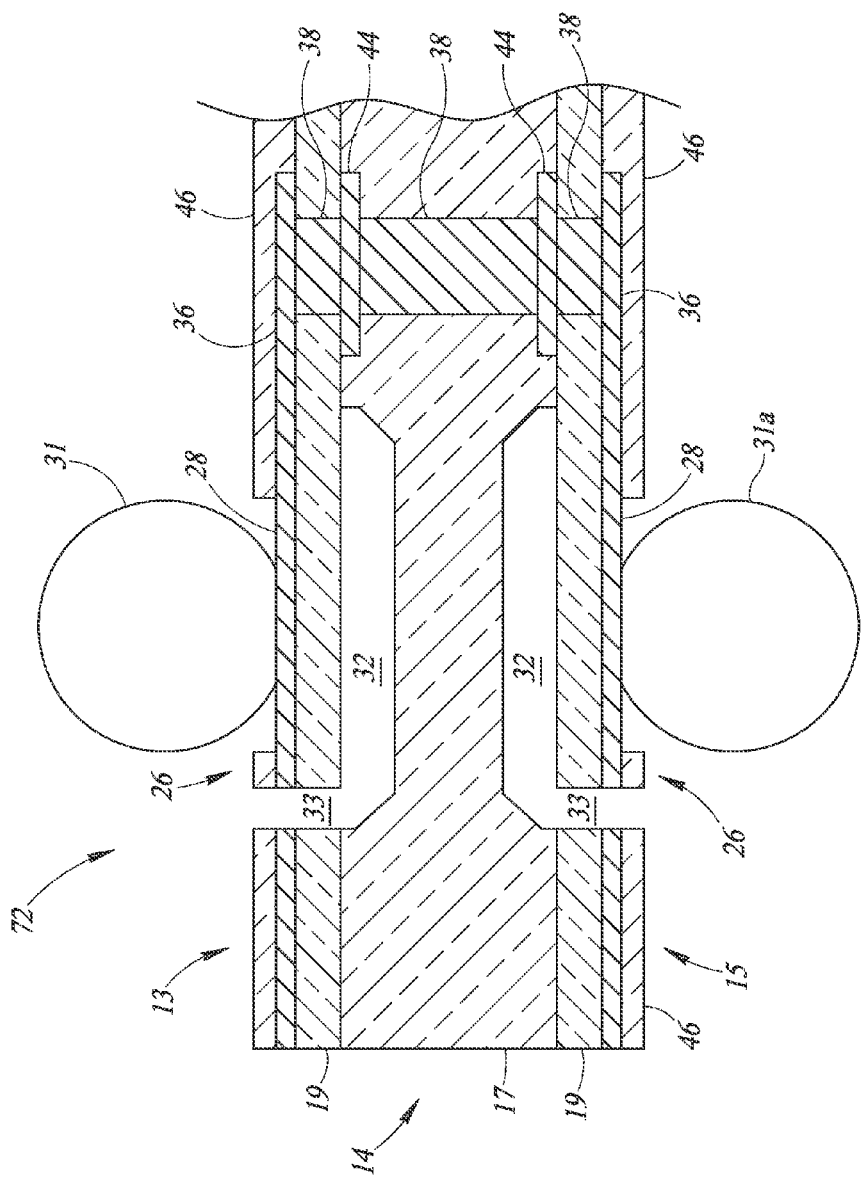
FIG. 5B is a close-up cross-sectional view of the PoP of FIG. 5A.

FIG. 5B shows a close up of second package 74 of the PoP 72. The second package 74 includes a semiconductor die 12 that is coupled to conductive pads on an upper surface 13 of a substrate 14 by conductive balls 31a in a flip chip arrangement as is well known in the art. The semiconductor die 12 and the conductive balls 31a are encapsulated by an encapsulating material 48 located on the upper surface 13 of the substrate 14.

The substrate includes three or more layers of insulative material, a first layer 17 and two second layers 19 on opposing sides of the first layer 17. The first layer 17 includes recesses 32 formed on the opposing sides. In the illustrated embodiment, the recesses 32 are formed opposite each other; however, it is to be understood that the recesses 32 may be offset from each other. The second layers 17 of insulative material include through openings 33 that mate with a portion of the recesses 32 in the first layer 17 of the insulative material. The second layers 17 form cantilever pads 26 over the recesses 32.

The substrate 14 includes conductive through vias 38 and inner traces 44 that provide electrical connection between the upper surface 13 of the substrate 14 and the lower surface 15 of the substrate 14. The conductive through vias 38 have first ends proximate the upper surface 13 and second ends proximate the lower surface 15. The first and second ends of the conductive through vias 38 are coupled to one or more cantilever pads 26 by traces 36. In that regard, the second package 72 includes cantilever pads 26 on the upper and lower surfaces of the substrate 14. The cantilever pads 26 may be opposite each other on the upper and lower surfaces as shown in FIG. 5 or may be offset from each other.

As best shown in FIG. 5A, the cantilever pads 26 on the upper surface of the second package 74 are coupled to the cantilever pads 26 of the first package 10 by the conductive balls 31. In that regard, the conductive balls 31 provide electrical communication between the first and second packages 10, 74. It is to be appreciated that in some embodiments only some of the pads, including one, may be cantilevered pads.

Conductive balls 31a are located on the second package 74. The conductive balls 31a provide electrical communication external to the PoP 72. In that regard, the conductive balls 31a provide external communication for both the first and second packages 10, 74. In particular, the first package 10 has an electrical path to conductive balls 31a through the conductive balls 31 and the conductive vias 38 and traces 44, 36 of the second package 74. The semiconductor die 12 of the second package 74 may be electrically coupled to the semiconductor die 12 of the first package 10, such as by the through vias 38, traces 44, 36, and cantilever pads 26. Although not illustrated, the first and second packages 10, 72 may be coupled together by a substrate by other conductive interconnects, such as conductive vias extending from opposing surfaces of the substrate.

The PoP 72 is formed using similar methods as those described above in reference to FIGS. 4A-4H. It will be appreciated however, both sides of the first layer 17 of insulative material will be processed to form the cantilever pads 26 on both sides. For instance, recesses 32 are formed on both sides of the first layer 17 of insulative material, and the traces 44 and the second layers 19 of insulative material are formed on both sides of the first layer 17 of the insulative material.

The conductive balls 31 may be first formed on the cantilever pads 26 of the first package 10 as described in reference to FIG. 4H. Alternatively the conductive balls 31, 31a are formed on the cantilever pads 26 of the second package 74.

The cantilever pads 26 allow for flexing of the conductive balls 31, 31a in the PoP 72. That is, the cantilever pads 26 may flex upward and/or downward to accommodate stresses acting thereon. In that regard, the first and second packages 10, 74 may remain substantially planar when the cantilever pad flexes, thereby reducing stresses acting on elements of the PoP 72.

Various embodiments discussed herein may use a variety of types of materials. One example of materials and thicknesses that may be used for the embodiments of FIGS. 1-5B is provided below. It is understood that the materials and thicknesses set for below are just one example and that many other material and thicknesses may be used.

The first layer 17 of insulative material of the substrate may be a core provided by Hitachi under part name E679-FGB and have a thickness of between about 0.095 and 0.225 mm, however, many other acceptable materials and suitable thickness may be used. The thickness of the first layer may depend on whether cantilever pads are formed on opposing sides of the substrate opposite each other or whether cantilever pads are formed on one side of the substrate or are offset from each other on opposing sides.

The second layers 19 of insulative material of the substrate may be pre-pregs provided by Hitachi under part name GEA-E679FG (GZPE) and have a thickness of between about 0.032 and 0.048 mm, however, many other acceptable materials and suitable thickness may be used. The recess in the first layer and openings in the second layer may be between about 0.04 and 0.60 mm. It will be understood by persons of skill in the art, that the thicknesses of the recesses and openings may be different depending on the materials used in the package, including the first layer of insulative material.

The traces 36, conductive pads 28, and conductive fingers 20 may be copper and may have thicknesses between about 0.012 and 0.023 mm. The dielectric layers 46 may be a solder mask provided by Taiyo under part name AUS 308 and have a thickness between about 0.010 and 0.030 mm.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A stacked package assembly, comprising:
   an upper package including:
      a first substrate having first and second surfaces;
      an opening at the second surface of the first substrate that forms a cavity between the first and second surfaces;
      a first cantilever pad suspended by the cavity, the first cantilever pad forming a portion of the second surface of the substrate,
      a first conductive pad located on the first cantilever pad; and
      a first semiconductor die coupled to the first surface of the first substrate, the first semiconductor die electrically coupled to the first conductive pad;
   a plurality of conductive balls coupled to the upper package; and
   a lower package stacked below the upper package, the lower package coupled to the upper package by the plurality of conductive balls, the lower package including:
      a second substrate having a third and fourth surfaces;
      a second opening at the third surface that forms a cavity in the second substrate between the third and fourth surfaces;
      a second cantilever pad suspended by the cavity and forming a portion of the third surface of the second substrate;
      a second conductive pad located on the second cantilever pad; and
      a second semiconductor die coupled to one of the third and fourth surfaces of the second substrate, one of the second semiconductor die and the first semiconductor die being electrically coupled to the second conductive pad.

2. The stacked package of claim 1 wherein the plurality of conductive balls is coupled at a first side to the second conductive pad and at a second side to the first conductive pad.

3. The stacked package of claim 1 wherein the first cantilevered pad and the first conductive pad are one of a plurality of first cantilevered pads and a plurality of first conductive pads, respectively.

4. The stacked package of claim 3 wherein the plurality of first cantilevered pads and the plurality of first conductive pads are located at a perimeter of the second surface.

5. The stacked package of claim 3 wherein the second cantilevered pad and the second conductive pad are one of a plurality of second cantilevered pads and a plurality of second conductive pads, respectively, wherein the plurality of second conductive pads are electrically coupled to the plurality of first conductive pads by the plurality of conductive balls.

6. The stacked package of claim 1 wherein the first and second cantilever pads are formed in part by one of a C-shape, U-shape, and V-shape through opening in the first and second substrates, respectively.

7. The stacked package of claim 1, further comprising:
   an opening at the fourth surface of the second substrate that forms a cavity in the second substrate; and
   a third cantilever pad extending over the cavity in the second substrate.

8. A package on package assembly, comprising:
   an upper package including a first semiconductor die coupled to a first surface of a first substrate, the first substrate including a plurality of first cantilevered pads that are in electrical communication with the first semiconductor die, the plurality of first cantilevered pads covering cavities, respectively, in the first substrate;
   a plurality of conductive interconnects coupled to the upper package; and
   a lower package located below the upper package, the lower package including a second semiconductor die coupled to a second surface of a second substrate, the lower package being coupled to the upper package by the plurality of conductive interconnects, the second substrate including a plurality of second cantilevered pads, the plurality of second cantilevered pads covering cavities, respectively, in the second substrate, at least one of the plurality of second cantilevered pads being in electrical communication with the first semiconductor die.

9. The package on package assembly of claim 8 wherein the plurality of second cantilevered pads are located on the second surface of the second substrate.

10. The package on package assembly of claim 8 wherein the plurality of second cantilevered pads are located on a third surface of the second substrate that is opposite the second surface.

11. The package on package assembly of claim 9 further comprising third cantilevered pads on the second surface of the second substrate, wherein the plurality of conductive interconnects are coupled at a first side to the plurality of first cantilevered pads and at a second side to the third cantilevered pads.

12. The package on package assembly of claim 11 wherein the third cantilevered pads and the second cantilevered pads overlap each other on opposing sides of the lower package.

13. The package on package assembly of claim 8 wherein the first semiconductor die is electrically coupled to the second semiconductor die by one or more of the plurality of conductive interconnects.

14. The package on package assembly of claim 8 wherein the conductive interconnects are conductive balls.

15. A method, comprising:
   forming conductive interconnects on upper package, the upper package including a first semiconductor die coupled to a first surface of a first substrate, the first substrate including a plurality of first cantilevered pads suspended by a plurality of cavities, respectively, in the first substrate, the first cantilevered pads being in electrical communication with the first semiconductor die, wherein forming the conductive interconnects comprises forming the conductive interconnects on the plurality of first cantilevered pads; and
   coupling a lower package to the conductive interconnects and forming a package on package assembly, the lower package including a second semiconductor die coupled to a second surface of a second substrate, the lower substrate including a plurality of second cantilevered pads suspended by a plurality of cavities, respectively, in the second substrate, at least one of the plurality of second cantilevered pads being in electrical communication with the first semiconductor die, wherein the coupling comprises coupling the plurality of second cantilevered pads to the conductive interconnects.

16. The method of claim 15 wherein after coupling the lower package, the plurality of first cantilevered pads are facing the second cantilevered pads.

17. The method of claim 15 wherein the first and second cantilever pads have at least one of a C-shape, U-shape, and V-shape.

18. The method of claim 15 wherein coupling the lower package to the conductive interconnects causes at least one of the first and second cantilevered pads to deflect.

19. The method of claim 15 wherein forming the conductive interconnects comprises dispensing the conductive interconnects on the plurality of first cantilevered pads.

* * * * *